United States Patent
Tang

(10) Patent No.: US 10,458,103 B2
(45) Date of Patent: Oct. 29, 2019

(54) FAUCET ASSEMBLY

(71) Applicant: Guangzhou Seagull Kitchen and Bath Products Co.,Ltd., Guangdong (CN)

(72) Inventor: Taiying Tang, Guangdong (CN)

(73) Assignee: Guangzhou Seagull Kitchen and Bath Products Co., Ltd., Guangdong (CN)

( * ) Notice: Subject to any disclaimer, the term of this patent is extended or adjusted under 35 U.S.C. 154(b) by 75 days.

(21) Appl. No.: 15/578,693

(22) PCT Filed: Nov. 28, 2015

(86) PCT No.: PCT/CN2015/095883
§ 371 (c)(1),
(2) Date: Nov. 30, 2017

(87) PCT Pub. No.: WO2016/192338
PCT Pub. Date: Dec. 8, 2016

(65) Prior Publication Data
US 2018/0216322 A1    Aug. 2, 2018

(30) Foreign Application Priority Data

Jun. 1, 2015 (CN) .......................... 2015 1 0292509
Jun. 1, 2015 (CN) ..................... 2015 2 0367891 U

(51) Int. Cl.
*F24H 1/18* (2006.01)
*E03C 1/044* (2006.01)
(Continued)

(52) U.S. Cl.
CPC .............. *E03C 1/044* (2013.01); *B01D 35/04* (2013.01); *E03B 7/045* (2013.01); *F16K 11/22* (2013.01);
(Continued)

(58) Field of Classification Search
CPC .......... Y10T 137/6497; F24D 17/0005; F24D 17/0089; F24H 1/188
See application file for complete search history.

(56) References Cited

U.S. PATENT DOCUMENTS 3,381,110 A * 4/1968 Fischer .................. F24H 1/188
                                                              392/451
3,581,057 A * 5/1971 Meyers .................. A47J 31/54
                                                              392/451
(Continued)

FOREIGN PATENT DOCUMENTS

CN          2390069        8/2000
CN        101586677       11/2009
(Continued)

OTHER PUBLICATIONS

"International Search Report (Form PCT/ISA/210)", dated Mar. 9, 2016, with English translation thereof, pp. 1-6.

*Primary Examiner* — Kevin F Murphy
(74) *Attorney, Agent, or Firm* — JCIPRNET

(57) ABSTRACT

A faucet assembly comprises: a water supply pipeline comprising a water outlet pipeline section and a water inlet pipeline section connected to each other, wherein the water inlet pipeline section contains a throat section with smaller cross sectional diameter; a shell made of hard materials and wrapped around the throat section, so as to define a closed space that contains air around the throat section, while the throat section has an opening to the closed space; a flexible membrane wrapping layer made of elastic materials and is hermetically sealed on the inner side of the shell, so that the closed space that contains air has an elastic, retractable and sealed boundary; a heater connected in series to the inlet pipeline section and is positioned in the upstream of the shell (Continued)

along the water outlet direction, to heat the water that is about to flow into the throat section.

8 Claims, 7 Drawing Sheets

(51) Int. Cl.
    *F24D 17/00*     (2006.01)
    *B01D 35/04*     (2006.01)
    *F16K 11/22*     (2006.01)
    *F16K 11/00*     (2006.01)
    *H03K 17/96*     (2006.01)
    *E03B 7/04*     (2006.01)
    *E03C 1/05*     (2006.01)

(52) U.S. Cl.
    CPC ........ *F16K 19/006* (2013.01); *F24D 17/0005* (2013.01); *F24D 17/0089* (2013.01); *F24H 1/188* (2013.01); *H03K 17/962* (2013.01); *E03C 1/055* (2013.01)

(56) References Cited

U.S. PATENT DOCUMENTS

| | | | | |
|---|---|---|---|---|
| 3,891,124 A * | 6/1975 | Dreibelbis | ............. | F24D 17/00 222/108 |
| 4,263,498 A * | 4/1981 | Meyers | ................... | F24H 1/188 137/205.5 |
| 4,424,767 A * | 1/1984 | Wicke | ................... | F16B 7/0413 122/13.3 |
| 4,513,887 A * | 4/1985 | Wicke | ................... | F16B 7/0413 222/146.5 |
| 4,990,746 A * | 2/1991 | Hammond | ................ | F24D 3/08 222/108 |
| 6,094,524 A * | 7/2000 | Riley | ...................... | F24H 1/188 392/441 |
| 6,847,782 B1 * | 1/2005 | Kovacs | .................. | F24H 1/202 392/441 |
| 9,797,625 B2 * | 10/2017 | Chen | ....................... | F24H 9/124 |
| 2006/0086649 A1 | 4/2006 | Wieczorek et al. | | |
| 2006/0272596 A1 * | 12/2006 | DeSantis | ................. | F24H 1/188 122/13.01 |
| 2007/0044736 A1 * | 3/2007 | DeSantis | ................. | F24H 1/188 122/19.1 |
| 2012/0051725 A1 * | 3/2012 | Chen | ................... | F24D 17/0089 392/443 |

FOREIGN PATENT DOCUMENTS

| | | |
|---|---|---|
| CN | 102121744 | 7/2011 |
| CN | 102408149 | 4/2012 |
| CN | 104888522 | 9/2015 |
| DE | 202005019664 | 2/2007 |

* cited by examiner

FAUCET ASSEMBLY

CROSS-REFERENCE TO RELATED APPLICATION

This application is a 371 of international application of PCT application serial no. PCT/CN2015/095883, filed on Nov. 28, 2015, which claims the priority benefit of China application no. 201520367891.4, filed on Jun. 1, 2015 and China application no. 201510292509.2, filed on June 1, 2015. The entirety of each of the above-mentioned patent applications is hereby incorporated by reference herein and made a part of this specification.

TECHNICAL FIELD

The present invention relates to a faucet assembly. More specifically, the present invention relates to a faucet assembly without retained water in the outlet conduit and without leakage in water outlet upon heating the water.

BACKGROUND

The existing combination faucet usually outputs water after the mixing of cold and hot water, but a certain amount of water is often retained in the outlet conduit after cutting off the water supply, which results in the need of emptying the retained water in the outlet conduit first at the next water supply, especially the need of draining out the retained cold water in the outlet conduit before hot water supplying. In such a way, it has caused the waste of water resources. The existing faucet assembly often adopts the pressure relief drainage device with complex structure and tedious assembly steps.

There are various types of control valves of the existing faucet, wherein the water mixing valve is mostly adopted in the combination faucet to adjust and control the water temperature with mechanical handle, but it is difficult to achieve the output of a variety of water flows by only using a certain type of valve when you need to supply a variety of water flows.

DESCRIPTION

A purpose of the present invention is to solve, at least, the above-mentioned problems and/or defects, and to provide, at least, the advantages that will be explained later.

Another purpose of the present invention is to provide a faucet assembly which can take advantage of the negative pressure to return water when the water supply is stopped, no water is retained in the water outlet pipeline section and at the same time no leakage occurs in the water outlet when heating the water.

Another purpose of the present invention is the faucet assembly adopting the touch induction technology for filtered water operation, which makes the operation more convenient and gives a stronger sense of science and technology. It controls the output of four kinds of water flows with the combination of touch induction and mechanical control, which improves the using experience of users.

To achieve these purposes and other advantages of the present invention, a faucet assembly is provided, consisting of:

A water supply pipeline, which comprises a water outlet pipeline section and a water inlet pipeline section connected to each other, wherein the water inlet pipeline section contains a throat section with smaller cross sectional diameter;

A shell, which is made of hard materials and wrapped around the throat section, so as to define a space that contains air around the throat section, while the throat section has an opening to the space;

A flexible membrane wrapping layer, which is made of elastic materials and is hermetically sealed on the inner side of the shell, so that the space that contains air has an elastic, retractable and sealed boundary;

A heater, which is connected in series to the water inlet pipeline section and is positioned in the upstream of the shell along the water outlet direction, to heat the water that is about to flow into the throat section.

Preferably, a vent hole which is interconnected to the outside is equipped on the shell, so that the flexible membrane wrapping layer can smoothly squeeze or fill the air between the outer side of the flexible membrane wrapping layer and the inner side of the shell in the process of expansion and filling.

Preferably, the faucet assembly also comprises another water inlet pipeline section, which is also connected to the water outlet pipeline section, that is, two water inlet pipeline sections share the water outlet pipeline section;

Said another water inlet pipeline section also contains a throat section with smaller cross sectional diameter; Another shell, which is made of hard materials and wrapped around the throat section, so as to define a space that contains air around the throat section, while the throat section has an opening to the space;

Another flexible membrane wrapping layer, which is made of elastic materials and is hermetically sealed on the inner side of the shell, so that the space that contains air has an elastic, retractable and sealed boundary;

No heater is provided in the other water inlet pipeline section.

Preferably, the water inlet pipeline section is equipped with a switch valve for cutting off the upstream flow of the heater in the upstream of the heater along the water outlet direction.

Preferably, said another water inlet pipeline section is equipped with a switch valve for cutting off the upstream flow of said another shell in the upstream of said another shell along the water outlet direction.

Preferably, the faucet assembly also comprises a filter which is connected in series to the water inlet pipeline section and is positioned in the upstream of the heater along the water outlet direction, to filter the water that is about to flow into the heater;

Preferably, said another water inlet pipeline section and the water inlet pipeline section share the filter.

Preferably, the faucet assembly also comprises:

A faucet, which comprises an outer shell with a water outlet;

A hose, which is set in the outer shell, and the first end of the hose is arranged in the water outlet, and the second end is connected to the outlet end of the water outlet pipeline section; a water outlet channel is confined between the outer surface of the hose and the inner surface of the outer shell; Another water supply pipeline, which is arranged parallel to the water supply pipeline, and said another water supply pipeline comprises a cold water outlet pipeline section and a hot water outlet pipeline section which are connected in parallel to each other; the cold and hot water outlet pipeline sections lead to the water outlet channel;

A water mixing valve, which is set in the outer shell, and the cold and hot water outlet pipeline sections lead to the water outlet channel through the water mixing valve.

Preferably, the faucet is also provided with:

A manual handle, which is mounted on the outer shell and connected to the water mixing valve, to operate the water mixing valve to enable said another water supply pipeline to output the water flow to the water outlet channel;

A capacitive touch switch, which is installed on the outer shell, the circuit of the capacitive touch switch is connected and the switch valve on the water inlet pipeline section and said another water inlet pipeline section is switched by capacitive touch.

Another purpose of the present invention is to provide a faucet assembly, which comprises:

A water supply pipeline, which comprises a water outlet pipeline section and a water inlet pipeline section connected to each other, wherein the water inlet pipeline section contains a throat section with smaller cross sectional diameter;

A shell, which is made of hard materials and wrapped around the throat section, so as to define a space that contains air around the throat section, while the throat section has an opening to the space;

A flexible membrane wrapping layer, which is made of elastic materials and is hermetically sealed on the inner side of the shell, so that the space that contains air has an elastic, retractable and sealed boundary;

A heater, which is connected in series to the water inlet pipeline section and is positioned in the upstream of the shell along the water outlet direction, to heat the water that is about to flow into the throat section;

Another water inlet pipeline section, which is also connected to the water outlet pipeline section, that is, two water inlet pipeline sections share the water outlet pipeline section;

Said another water inlet pipeline section also contains a throat section with smaller cross sectional diameter;

Said another shell, which is made of hard materials and wrapped around the throat section, so as to define a space that contains air around the throat section, while the throat section has an opening to the space;

Said another flexible membrane wrapping layer, which is made of elastic materials and is hermetically sealed on the inner side of the shell, so that the space that contains air has an elastic, retractable and sealed boundary;

Said another water inlet pipeline section does not have a heater.

Preferably, a vent hole which is interconnected to the outside is equipped on the shell, so that the flexible membrane wrapping layer can smoothly squeeze or fill the air between the outer side of the flexible membrane wrapping layer and the inner side of the shell in the process of expansion and filling.

Preferably, the water inlet pipeline section is equipped with a switch valve for cutting off the upstream flow of the heater in the upstream of the heater along the water outlet direction.

Preferably, Said another water inlet pipeline section is equipped with a switch valve for cutting off the upstream flow of said another shell in the upstream of said another shell along the water outlet direction.

Preferably, the faucet assembly also comprises a filter which is connected in series to the water inlet pipeline section and is positioned in the upstream of the heater along the water outlet direction, to filter the water that is about to flow into the heater;

Preferably, said another water inlet pipeline section and the water inlet pipeline section share the filter.

Preferably, the faucet assembly also comprises:

A faucet, which comprises an outer shell with a water outlet;

A hose, which is set in the outer shell, and the first end of the hose is arranged in the water outlet, and the second end is connected to the outlet end of the water outlet pipeline section; and a water outlet channel is confined between the outer surface of the hose and the inner surface of the outer shell;

Said another water supply pipeline, which is arranged parallel to the water supply pipeline, and said another water supply pipeline comprises a cold water outlet pipeline section and a hot water outlet pipeline section which are connected in parallel to each other; the cold and hot water outlet pipeline sections lead to the water outlet channel;

A water mixing valve, which is set in the outer shell, and the cold and hot water outlet pipeline sections lead to the water outlet channel through the water mixing valve.

Preferably, the faucet is also provided with:

A manual handle, which is mounted on the outer shell and connected to the water mixing valve, to operate the water mixing valve to enable said another water supply pipeline to output the water flow to the water outlet channel;

A capacitive touch switch, which is installed on the outer shell, the circuit of the capacitive touch switch is connected and the switch valve on the water inlet pipeline section and said another water inlet pipeline section is switched by capacitive touch.

Another purpose of the present invention is to provide a faucet assembly, which comprises:

A water supply pipeline, which comprises a water outlet pipeline section and a water inlet pipeline section connected to each other, wherein the water inlet pipeline section contains a throat section with smaller cross sectional diameter;

A shell, which is made of hard materials and wrapped around the throat section, so as to define a space that contains air around the throat section; while the throat section has an opening to the space;

A flexible membrane wrapping layer, which is made of elastic materials and is hermetically sealed on the inner side of the shell, so that the space that contains air has an elastic, retractable and sealed boundary;

A heater, which is connected in series to the water inlet pipeline section and is positioned in the upstream of the shell along the water outlet direction, to heat the water that is about to flow into the throat section;

A filter, which is connected in series to the water inlet pipeline section and is positioned in the upstream of the heater along the water outlet direction, to filter the water that is about to flow into the heater;

Preferably, the faucet assembly also comprises another water inlet pipeline section, which is also connected to the water outlet pipeline section, that is, two water inlet pipeline sections share the water outlet pipeline section;

Said another water inlet pipeline section also contains a throat section with smaller cross sectional diameter;

Another shell, which is made of hard materials and wrapped around the throat section, so as to define a space that contains air around the throat section; while the throat section has an opening to the space;

Another flexible membrane wrapping layer, which is made of elastic materials and is hermetically sealed on the inner side of the shell, so that the space that contains air has an elastic, retractable and sealed boundary;

Said another water inlet pipeline section does not have a heater.

Preferably, a vent hole which is interconnected to the outside is equipped on the shell, so that the flexible membrane wrapping layer can smoothly squeeze or fill the air between the outer side of the flexible membrane wrapping layer and the inner side of the shell in the process of expansion and filling.

Preferably, the water inlet pipeline section is equipped with a switch valve for cutting off the upstream flow of the heater in the upstream of the heater along the water outlet direction.

Preferably, said another water inlet pipeline section is equipped with a switch valve for cutting off the upstream flow of said another shell in the upstream of said another shell along the water outlet direction.

Preferably, said another water inlet pipeline section and the water inlet pipeline section share the filter.

Preferably, the faucet assembly also comprises:

A faucet, which comprises an outer shell with a water outlet;

A hose, which is set in the outer shell, and the first end of the hose is arranged in the water outlet, and the second end is connected to the outlet end of the water outlet pipeline section; and a water outlet channel is confined between the outer surface of the hose and the inner surface of the outer shell;

Another water supply pipeline, which is arranged parallel to the water supply pipeline, and said another water supply pipeline comprises a cold water outlet pipeline section and a hot water outlet pipeline section which are connected in parallel to each other, wherein the cold and hot water outlet pipeline sections lead to the water outlet channel;

A water mixing valve, which is set in the outer shell, and the cold and hot water outlet pipeline sections lead to the water outlet channel through the water mixing valve.

Preferably, the faucet is also provided with:

A manual handle, which is mounted on the outer shell and connected to the water mixing valve, to operate the water mixing valve to enable said another water supply pipeline to output the water flow to the water outlet channel;

A capacitive touch switch, which is installed on the outer shell, the circuit of the capacitive touch switch is connected and the switch valve on the water inlet pipeline section and said another water inlet pipeline section is switched by capacitive touch.

Another purpose of the present invention is to provide a faucet assembly, wherein a Venturi effect part is equipped between the water inlet and the water outlet of its water supply pipeline, and a reduction part of the partial cross section of the Venturi effect part leads to a closed space confined by the deformable elastic flexible membrane; the flexible membrane gradually shrinks under the action of the Venturi effect part in the water supply, which expands gradually and generates backwater effect under the action of atmospheric pressure when the water supply is stopped, due to the negative pressure in the closed space. The flexible membrane is deformable elastic, so it can provide better closed space which is connected to the reduction part of the partial cross section of Venturi effect part. The reduction part of the partial cross section is, for instance, the nozzle set in the upstream of the water outlet direction, and the throat tube set in the downstream of the nozzle, between which a certain gap is constructed, and the gap is connected to the closed space. When the water flows through the reduction part of the partial cross section, the water will flow out with the air in the closed space, resulting in the shrinkage of the flexible membrane. The flexible membrane will provide a higher degree of suction than that in the non-deformable closed space made up of rigid materials, thereby offering a higher degree of suction to suck back the retained water in the outlet conduit.

Preferably, the flexible membrane is set in a shell with a vent hole; the shell is mounted on the water supply pipeline which defines a holding space to accommodate the closed space. The shell can protect the flexible membrane, to avoid it from being damaged by the external force. The flexible membrane, for example, is made of silica gel and elastic rubber.

Preferably, the faucet assembly also comprises a first control valve and a second control valve arranged on the outlet conduit of water supply pipeline, wherein the first control valve is a touch switch and the second control valve is a mechanical valve. The first control valve and the second control valve are respectively connected to the supply pipeline to output hot filtered water, clod filtered water, clod tap water and hot tap water.

Preferably, the water supply pipeline comprises a filtered water supply pipeline and a tap water supply pipeline; a filter is equipped on the filtered water supply pipeline; a heater is set in the downstream of the filter; and the first control valve controls the filtered water supply pipeline.

Preferably, the filtered water supply pipeline comprises a water inlet and a water outlet, and a hot water supply pipeline is connected between the water inlet and the water outlet, and the heater is arranged on the hot water supply pipeline.

Preferably, the hot water supply pipeline comprises a second water inlet pipe connecting the water inlet, on which a second solenoid valve is equipped; the second water inlet pipe extends into the heater, on which a Venturi effect part is provided, and a reduction part of the partial cross section of the Venturi effect part leads to the closed space confined by the flexible membrane in the shell.

Preferably, the filtered water supply pipeline comprises a water inlet and a water outlet, an independent cold water supply pipeline and an independent hot water supply pipeline are connected in parallel between the water inlet and the water outlet, and the heater is arranged on the hot water supply pipeline. The cold water supply pipeline and the hot water supply pipeline are relatively independent. The tap water is discharged from the water outlet directly through the cold water supply pipeline after going through the filter. When hot water is needed, the cold water passed through the filter enters the heater for heating and is then discharged through the water outlet and hot water at different temperatures is provided by setting the heater temperature rather than using the water mixing component, to improve the quality of drinking water.

Preferably, the cold water supply pipeline comprises a first water inlet pipe, on which a first solenoid valve is equipped; and a first water outlet pipe, on which a Venturi effect part is arranged, and the reduction part of the partial cross section of the Venturi effect part is connected to the closed space confined by the flexible membrane in the holding closed space. The hot water supply pipeline comprises:

A second water inlet pipe connected to the water inlet, on which a second solenoid valve is equipped; the second water inlet pipe extends into the heater, on which a Venturi effect part is provided, and the reduction part of the partial cross section of the Venturi effect part leads to the closed space confined by the flexible membrane in the shell;

A second water outlet pipe connected to the water outlet, on which a one-way valve is equipped;

And a backwater pipe connected to the water outlet, on which a backwater solenoid valve is equipped; the backwater pipe is connected to the heater The flexible membrane, for example, can be incorporated in the shell, the holding space is slightly larger than the closed space confined by the flexible membrane, thus forming a structure that not only can effectively protect the flexible membrane from avoiding being destroyed due to the misuse of the installers, but also can avoid the corrosion in high humidity and high heat environment.

The hot water supply pipeline comprises: the second water inlet pipe connected to the water inlet, on which the second solenoid valve is equipped; the second water inlet pipe extends into the heater, on which the Venturi effect part is provided, and the reduction part of the partial cross section of the Venturi effect part leads to the closed space confined by the flexible membrane in the shell.

The Venturi effect part, such as the one including the nozzle formed at the upper reach along the water outlet direction and the throat tube formed in the downstream of the nozzle, and the cross section of the nozzle and the throat tube are smaller than the cross section of the water outlet pipe, thus forming a Venturi effect part. When the water erupts from the nozzle, the high-speed water flow will take away the air in the closed space, so that a negative pressure is formed in the closed space. When the first water outlet pipe stops flowing water out, the water in the outlet conduit will be sucked back to the closed space under the action of atmospheric pressure in connection with the atmosphere.

The hot water supply pipeline also comprises a second water outlet pipe connected to the water outlet, on which a one-way valve is equipped; the one-way valve is arranged to avoid the cold backwater from pouring into the heater when the cold water is returned.

And a backwater pipe connected to the water outlet, on which a backwater solenoid valve is equipped; the backwater pipe is connected to the heater.

Preferably, the heater comprises:

A barrel body, which defines a closed space for water storage and heating; the second water inlet pipe passes through the top of the barrel body and extends into the barrel body; the closed space is arranged at the top of the barrel body; the closed space, for instance, is set in a shell, the shell has a horizontal section shape similar to the barrel body, which is provided on the second water inlet pipe. When the heating temperature of heater rises and the moisture expands, a small amount of water in the heater will flow into the water absorber, so as to avoid the hot water from leaking through the water outlet when heating.

A heating tube, which is arranged at the bottom of the barrel body.

Preferably, when the faucet assembly supplies water and the cold water supply pipeline supplies water, touching the touch switch and turning on the first solenoid valve for water supply, the flexible membrane connected to the first water outlet pipe shrinks under the action of Venturi effect part, to generate negative pressure in the closed space confined by it; re-touching the touch switch, the cold water supply pipeline is cut off, and the water in the first water outlet conduit is sucked back into the closed space formed in the flexible membrane, to complete the cold water return operation. The solenoid valve is used to control the opening and closing of the water supply pipeline, so as to improve the sense of science and technology. Meanwhile, the user can turn on or turn off the water supply by touching, making the operation more convenient.

Preferably, when hot water supply pipeline supplies water, pressing and holding the touch switch for three seconds to turn on the second solenoid valve, the cold water enters the heater for heating through the second water inlet pipe, after that, the water flows to the water outlet through the one-way valve on the second water outlet. At the same time, the flexible membrane connected to the second water outlet pipe shrinks under the action of Venturi effect part, to generate negative pressure in the closed space confined by it; empty out the closed space; re-touching and holding the touch switch, the second solenoid valve is turned off and the backwater solenoid valve is turned on, the hot water in the second outlet conduit flows into the heater through the backwater solenoid valve and returns back to the closed space to complete the hot water return operation. The first solenoid valve, the second solenoid valve and the backwater solenoid valve can be set to the normally closed state. Of course, the first solenoid valve and the second solenoid valve can be set to the normally closed state, while the backwater solenoid valve can be set to the normally opened state.

Preferably, the flexible membrane is the gel silica membrane.

The present invention comprises at least the following advantageous effects: as the shell and the flexible membrane wrapping layer are equipped on the throat section of the water supply pipelines, a larger negative pressure will be formed in the closed space inside the shell when the water supply pipeline supplies water, and no retained water in the water pipes set in the water outlet pipeline section can be realized when turning off the faucet, at the same time, no leakage in the water outlet can be also achieved when heating the water.

A manual handle and a capacitive touch switch are arranged on the faucet, and the touch induction technology is adopted for filtered water operation, which makes the operation more convenient and gives a stronger sense of science and technology. It controls the output of four kinds of water flows with the combination of touch induction and mechanical control, which improves the using experience of users.

As Venturi effect part is equipped on the water supply pipe, on which a closed space confined by the deformable elastic flexible membrane is connected, relative to the rigid material closed space, it has a larger deformable closed space, wherein a larger negative pressure can be formed. No retained water in the outlet conduit can be realized when turning off the faucet, at the same time, no leakage in the water outlet can be achieved when heating the water.

The control valves of the faucet assembly are set respectively to control the mechanical valve and the touch switch, so as to realize the output of four kinds of water, i.e., cold tap water, hot tap water, filtered water, which can be called the cold drinking water, and filtered water, which can be called the cold drinking water;

The faucet adopts the touch induction technology for filtered water operation, which makes the operation more convenient and gives a stronger sense of science and technology;

The water absorber adopted in the heater return pipeline uses a non-bearing structure, making the heating safer;

The faucet assembly is not provided with a pressure relief drainage device, making the installation more convenient and giving more beautiful appearance.

Other advantages, purposes and features of the present invention will be partially described below, and partially will be understood by the technicians in the field through the research and practice of the present invention.

DETAILED DESCRIPTION

A detailed description of the present invention/the invention is provided in conjunction with the figures so as to enable the technicians in the field to carry out it by reference to the Specifications.

It should be understood that the terms used in the Specifications, such as "have", "contain", "include" and "comprise", do not mean the existence or addition of one or several other elements or their combinations.

Figure 1:
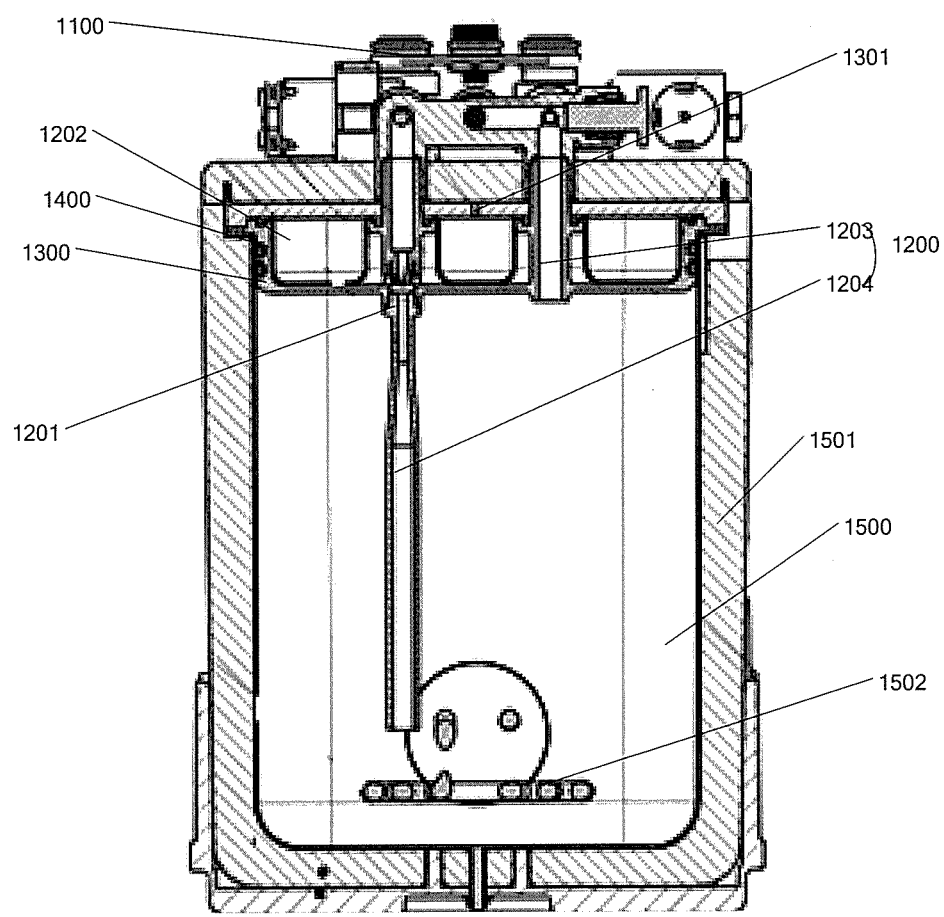
FIG. 1 is a schematic diagram of partial structure of the faucet assembly in one embodiment of the present invention.

As shown in FIG. 1, the faucet assembly described in one of the embodiment of the present invention comprises:

A water supply pipeline, which comprises a water outlet pipeline section 1100 and a water inlet pipeline section 1200 connected to each other, wherein the water inlet pipeline section 1200 contains a throat section 1201 with smaller cross sectional diameter;

The shell 1300, which is made of hard materials and wrapped around the throat section 1201, so as to define a space 1202 that contains air around the throat section 1201, while the throat section 1201 has an opening to the space 1202;

The flexible membrane wrapping layer 1400, which is made of elastic materials and is hermetically sealed on the inner side of the shell 1300, so that the space 1202 that contains air has an elastic, retractable and sealed boundary;

The heater 1500, which is connected in series to the water inlet pipeline section1200 and is positioned upstream of the shell 1300 along the water outlet direction, to heat the water that is about to flow into the throat section 1201. As shown in FIG. 1, the water inlet pipeline section 1200 can be divided into two sections, i.e., section 1203 and section 1204, the throat section 1201 is arranged on section 1204; the heater 1500, for example, has the shell 1501, and the shell 1300, for example, is arranged at the top of the shell 1501, the heating tube 1502 is equipped on the bottom of the heater 1500 for heating the water flowing into the throat section 1201.

As shown in FIG. 1, in one of the embodiment, the shell 1300 is provided with the vent hole 1301 interconnected to the outside, so that the flexible membrane wrapping layer 1400 can smoothly squeeze or fill the air between the outer side of the flexible membrane wrapping layer 1400 and the inner side of the shell 1300 in the process of expansion and filling.

Figure 2:
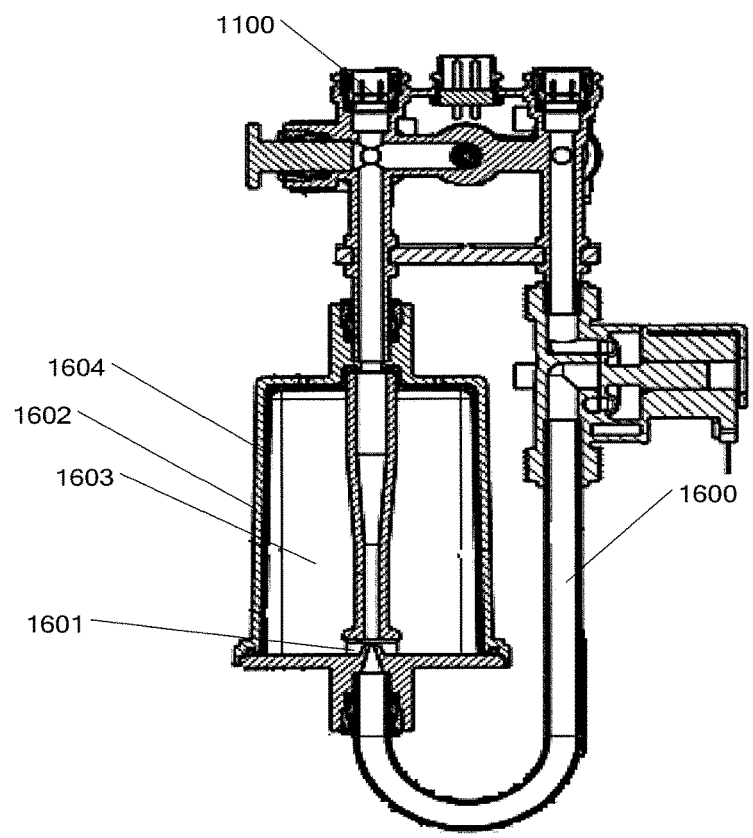
FIG. 2 is a schematic diagram of partial structure of the faucet assembly in one embodiment of the present invention.

As shown in FIG. 2, in one of the embodiment, the faucet assembly also comprises another water inlet pipeline section 1600, which is connected to the water outlet pipeline section 1100, i.e., two water inlet pipeline sections 1200 and 1600 share the water outlet pipeline section 1100;

Said another water inlet pipeline section 1600 also contains a throat section 1601 with smaller cross sectional diameter;

Another shell 1602, which is made of hard materials and wrapped around the throat section 1601, so as to define a space 1603 that contains air around the throat section 1601, while the throat section 1601 has an opening to the space 1603;

Another flexible membrane wrapping layer 1604, which is made of elastic materials and is hermetically sealed on the inner side of the shell 1602, so that the closed space 1603 that contains air has an elastic, retractable and sealed boundary, and not equipped with a heater.

Figure 3:
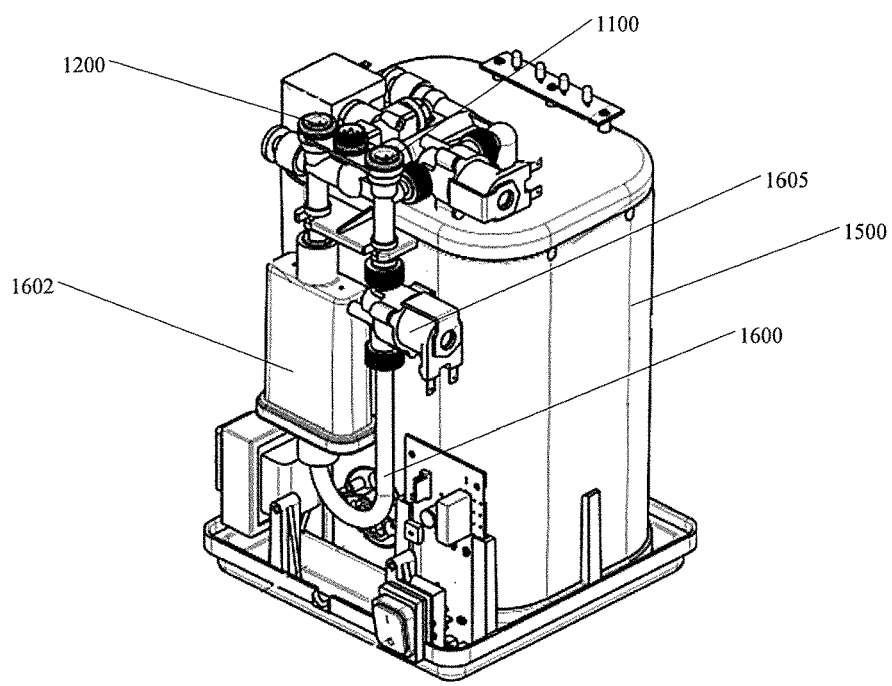
FIG. 3 is a schematic diagram of the three-dimensional structure of the faucet assembly in one embodiment of the present invention.

As shown in FIG. 3, in one of the embodiment, the water inlet pipeline section 1200 is provided with a shut-off valve for cutting off the upstream flow of the heater 1500 in the upstream side of the heater 1500 along the water outlet direction.

As shown in FIG. 3, in one of the embodiment, said another water inlet pipeline section 1600 is provided with a shut-off valve 1605 for cutting off the upstream flow of said another shell 1602 in the upstream side of said another shell 1602 along the water outlet direction.

Figure 4:
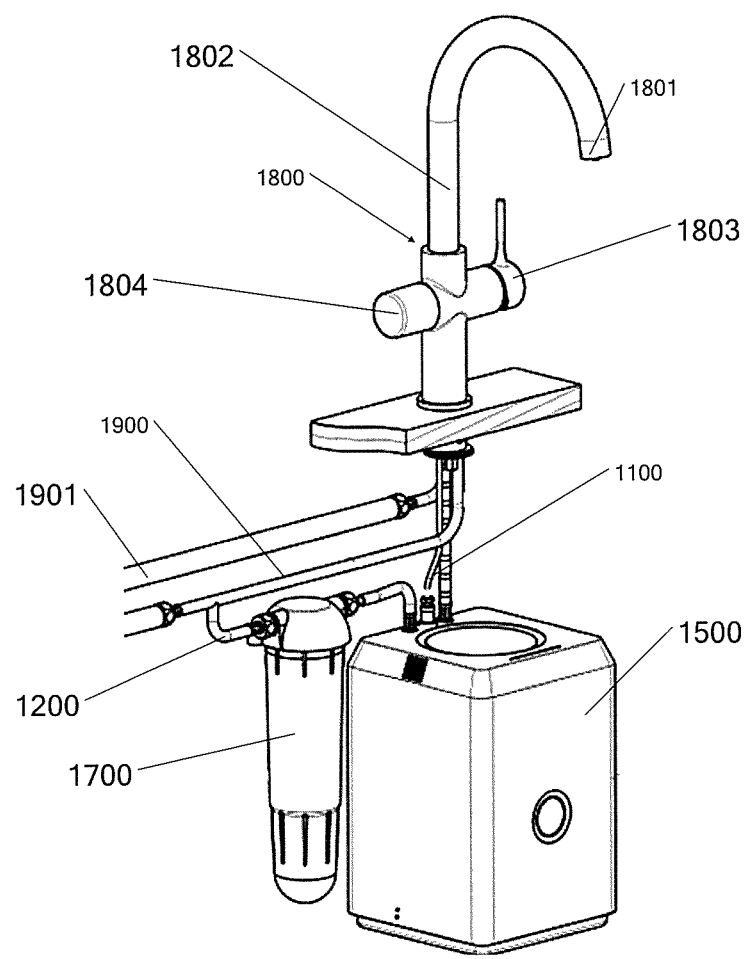
FIG. 4 is a schematic diagram of the three-dimensional structure of the faucet assembly in one embodiment of the present invention.

As shown in FIG. 4, in one of the embodiment, the faucet assembly also comprises the filter 1700, which is connected in series to the water inlet pipeline section 1200 and set in the upstream side of the heater 1500 along the water outlet direction, to filter the water that is about to flow into the heater 1500.

As shown in FIG. 4, in one of the embodiment, said another water inlet pipeline section 1600 and the water inlet pipeline section 1200 share the filter 1700.

As shown in FIG. 4, in one of the embodiment, the faucet assembly also comprises:

A faucet 1800, which comprises an outer shell 1802 with a water outlet 1801;

A hose (not shown in the figures), which is set in the outer shell 1802, and the first end of the hose is arranged in the water outlet 1801, and the second end is connected to the outlet end of the water outlet pipeline section 1100; and a water outlet channel is confined between the outer surface of the hose and the inner surface of the outer shell 1802;

Another water supply pipeline, which is arranged parallel to the water supply pipeline such as the water inlet pipeline section 1200, and said another water supply pipeline comprises a cold water outlet pipeline section 1900 and a hot water outlet pipeline section 1901 which are connected in parallel to each other, wherein the cold water outlet pipeline section 1900 and hot water outlet pipeline section 1901 lead to the water outlet channel;

A water mixing valve (not shown in the figures), which is set inside the outer shell 1802, and the cold water outlet pipeline section 1900 and the hot water outlet pipeline section 1901 lead to the water outlet channel after passing through the water mixing valve (not shown in the figures).

As shown in FIG. 4, in one of the embodiment, the faucet is also provided with:

The manual handle 1803, which is mounted on the outer shell 1802 and connected to the water mixing valve (not shown in the figures), to operate the water mixing valve to enable said another water supply pipeline to output the water flow to the water outlet channel;

The capacitive touch switch 1804, which is installed on the outer shell 1802. The capacitive touch switch 1804 is connected in a circuit with a switch valve provided on the water inlet pipeline section 1200 and said another water inlet pipeline section 1600 so as to switch the water flow between the water inlet pipeline section 1200 and said another water inlet pipeline section 1600 by capacitive touch (not shown in the figures).

As shown in FIG. 1, FIG. 2 and FIG. 3, the faucet assembly described in one of the embodiment of the present invention comprises:

A water supply pipeline, which comprises a water outlet pipeline section 1100 and a water inlet pipeline section 1200 connected to each other, wherein the water inlet pipeline section 1200 contains a throat section 1201 with smaller cross sectional diameter;

A shell 1300, which is made of hard materials and wrapped around the throat section 1201, so as to define a space 1202 that contains air around the throat section 1201, while the throat section 1201 has an opening to the space 1202;

A flexible membrane wrapping layer 1400, which is made of elastic materials and is hermetically sealed on the inner side of the shell 1300, so that the space 1202 that contains air has an elastic, retractable and sealed boundary;

A heater 1500, which is connected in series to the water inlet pipeline section 1200 and is positioned upstream of the shell 1300 along the water outlet direction, to heat the water that is about to flow into the throat section 1201. As shown in FIG. 1, the water inlet pipeline section 1200 can be divided into two sections, i.e., section 1203 and section 1204, the throat section 1201 is arranged on section 1204; the heater 1500, for example, has the outer shell 1501, and the shell 1300, for example, is arranged at the top of the outer shell 1501, the heating tube 1502 is equipped on the bottom of the heater 1500 for heating the water flowing into the throat section 1201.

Another water inlet pipeline section 1600, which is connected to the water outlet pipeline section 1100, i.e., two water inlet pipeline sections 1200 and 1600 share the water outlet pipeline section 1100;

Said another water inlet pipeline section 1600 also contains a throat section 1601 with smaller cross sectional diameter;

Another shell 1602, which is made of hard materials and wrapped around the throat section 1601, so as to define a space 1603 that contains air around the throat section 1601, while the throat section 1601 has an opening to the space 1603;

Another flexible membrane wrapping layer 1604, which is made of elastic materials and is hermetically sealed on the inner side of the shell 1602, so that the space 1603 that contains air has an elastic, retractable and sealed boundary, and not equipped with a heater.

Figure 5:
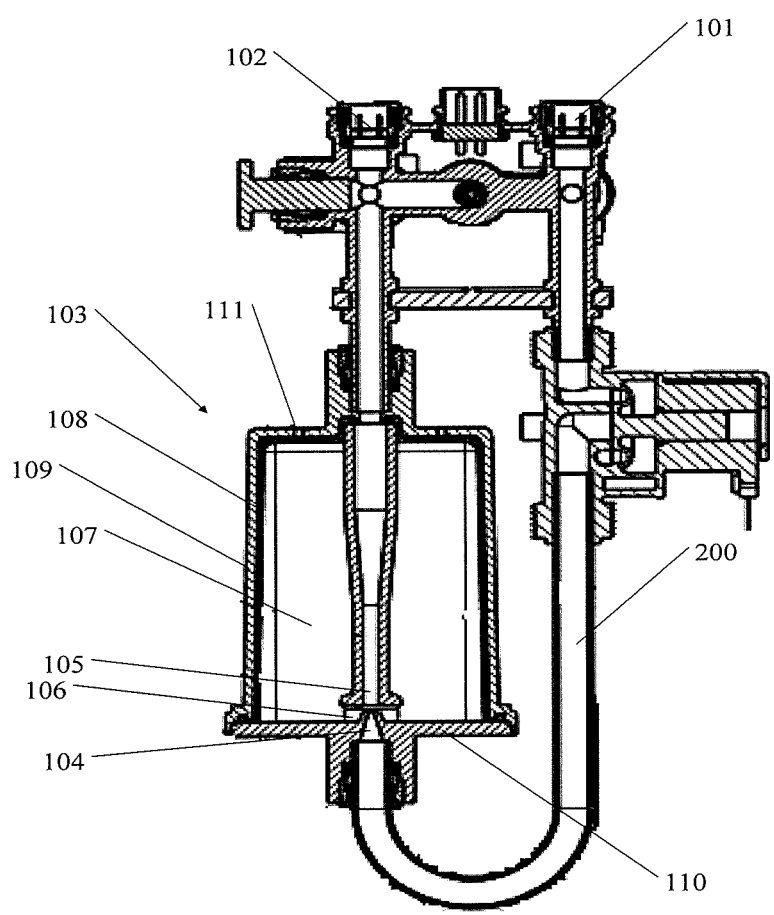
FIG. 5 is a schematic diagram of the structure of the water supply pipeline in the faucet assembly in one embodiment of the present invention.

FIG. 5 shows an implementation form based on the present invention, wherein the faucet assembly comprises: the Venturi effect part 103, which is equipped between the water inlet 101 and the water outlet 102 of the water supply pipeline, and the reduction part of the partial cross section of the Venturi effect part 103 leads to the closed space 107 confined by the deformable elastic flexible membrane 108; the flexible membrane 105 gradually shrinks under the action of the Venturi effect part 103 in the water supply, which generates backwater effect by taking advantage of the negative pressure when the water supply is stopped. The flexible membrane 108, for example, is the gel silica membrane, which is deformable elastic, so it can provide a better closed space and the closed space 107 is connected to the reduction part of the partial cross section of Venturi effect part. The reduction part of the partial cross section is, for instance, the nozzle 104 set in the upstream of the water outlet direction, and the throat tube 105 set in the downstream of the nozzle 104, between which the air generating chamber 106 is constructed, and the air generating chamber 106 is connected to the closed space 107. When the water flows through the reduction part of the partial cross section, the water will flow out with the air in the closed space 107 after passing through the air chamber 106, resulting in the shrinkage of the flexible membrane 105. The flexible membrane 105 will provide a higher degree of suction than that in the non-deformable closed space made up of rigid materials, thereby offering a higher degree of suction to suck back the retained water in the outlet conduit. The flexible membrane 108, for example, is connected onto the water supply pipeline by the ways shown in FIG. 1, the flexible membrane 108, for instance, is included in the shell 109 with one end opened and one end closed, and the seal cartridge in the closed end of the shell 109 is arranged on the water supply pipe, the seal in the opened end of the shell 109 is connected to the base 110, and the circumferential seal of the flexible membrane 108 is fixed in between the side edges of the shell 109 and the base 110. The shell 109 is provided with the vent hole 111.

Figure 6:
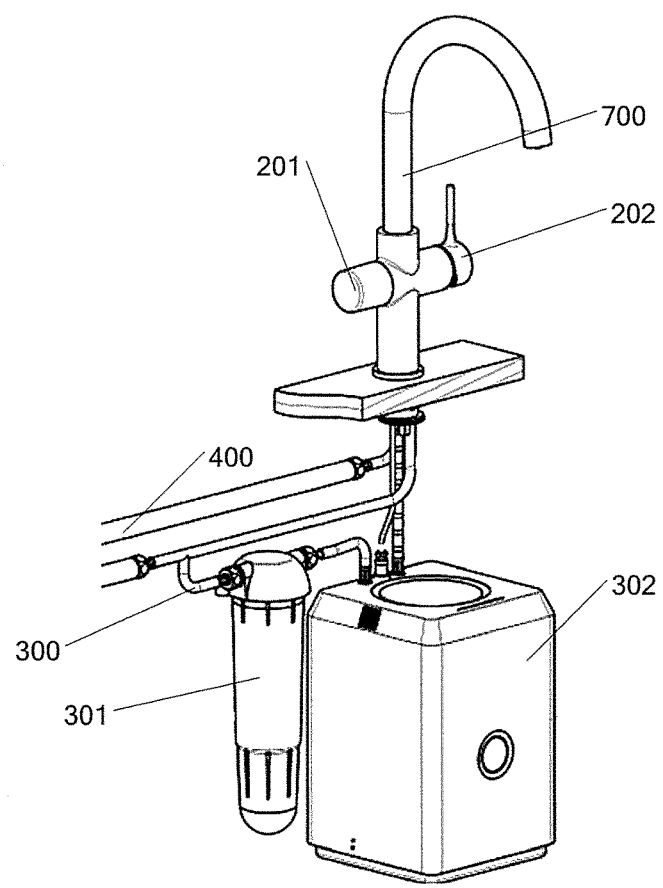
FIG. 6 is a schematic diagram of the three-dimensional structure of the faucet assembly in one embodiment of the present invention.

As shown in FIG. 6, the faucet assembly described in the present invention also comprises: the first control valve 201 and the second control valve 202 equipped on the outlet conduit 700 of the faucet assembly, which are respectively connected to the water supply pipelines to output cold filtered water, hot filtered water, cold tap water and hot tap water; the water supply pipeline comprises the filtered water supply pipeline 300 and the tap water supply pipeline 400; the filter 301 is set on the filtered water supply pipeline 300, and the heater 302 is arranged in the downstream of the filter 301. The first control valve 201, for example, is a touch switch, which controls the connection of the filtered water supply pipeline 300.

Figure 7:
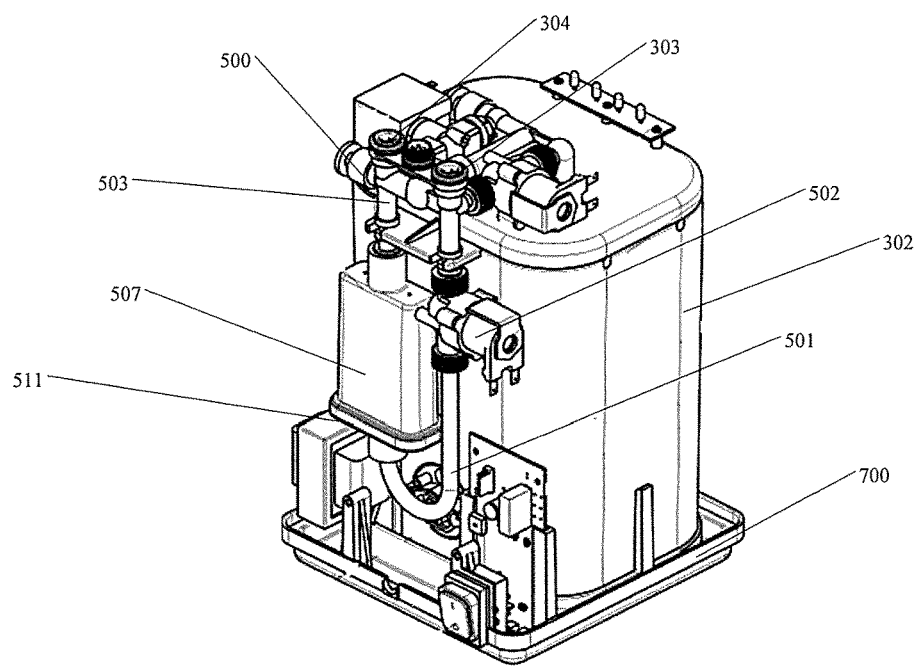
FIG. 7 is a schematic diagram of the structure of the filtered water supply system of the faucet assembly in another embodiment of the present invention.
Figure 8:
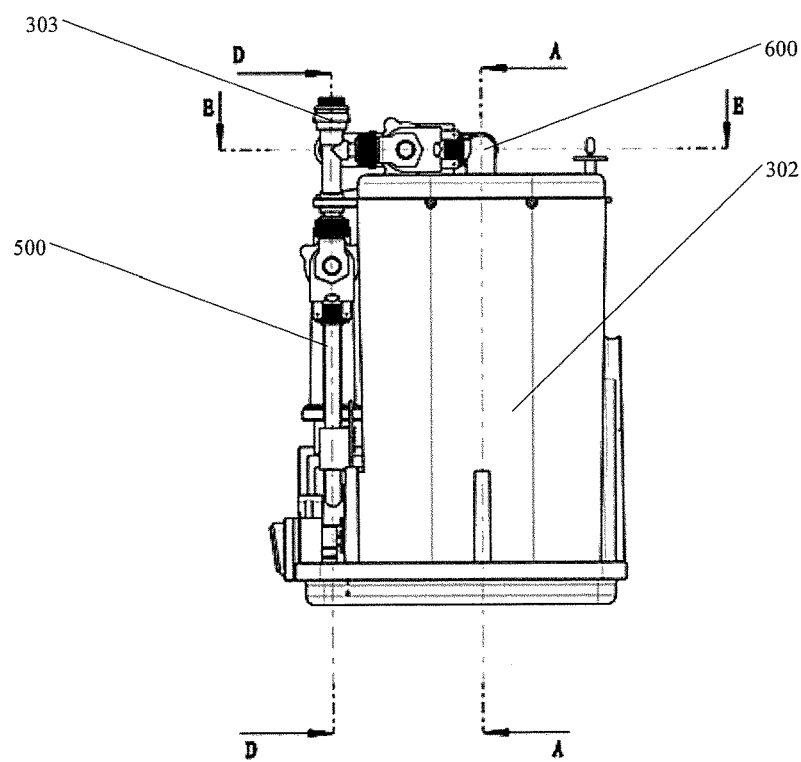
FIG. 8 is a side view of the filtered water supply system of the faucet assembly in another embodiment of the present invention.
Figure 9:
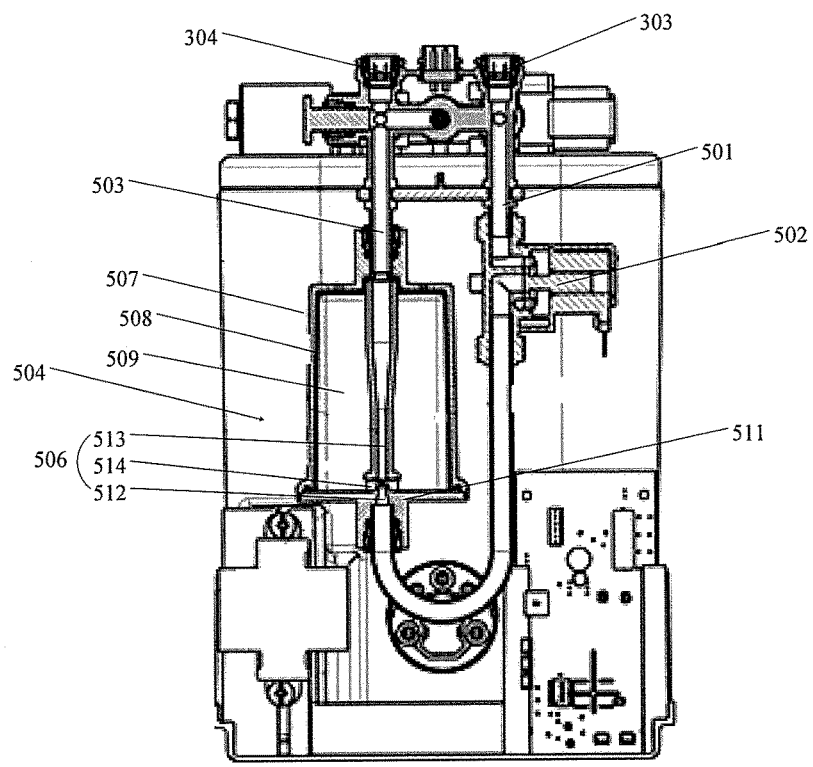
FIG. 9 is a schematic diagram of the section along D-D direction in FIG. 8.

As shown in FIG. 7-FIG. 9, the filtered water supply pipeline 300 comprises the water inlet 303 and the water outlet 304, the independent cold water supply pipeline 500 and the independent hot water supply pipeline 600 are connected in parallel between the water inlet 303 and the water outlet 304, and the heater 302 is arranged on the hot water supply pipeline 600. The heater 302, for example, is mounted on the fixed base 700. It can be seen from FIG. 4 that the cold water supply pipeline 500 and the hot water supply pipeline 600 are relatively independent amounted, and the cold water is discharged from the water outlet through the heater 302 on the hot water supply pipeline 600.

As shown in FIG. 7, the cold water supply pipeline 500 comprises the first water inlet pipe 501, on which the first solenoid valve 502 is equipped; the first water outlet pipe 503, as shown in FIG. 5, on which the Venturi effect part 504 is mounted, and the reduction part 506 of the partial cross section of the Venturi effect part 504 is connected to the closed space 509 confined by the flexible membrane 508 inside the shell 507. The closed space 509 is set in the shell 510 which comprises a noumenon with one end opened and one end closed. The closed end of the noumenon is equipped through the first water inlet 501, the seal at the open end of the noumenon is connected to the base 511 and the circumferential seal between the base 511 and the open end of the noumenon is connect to the periphery of the flexible membrane 508. The reduction part of the partial cross section of the Venturi effect part comprises: the nozzle 512 equipped through the base 511, the throat tube 513 set in the downstream of the nozzle 512, the air chamber 514 confined in the free end of the nozzle 512 and the throat tube 513, and the closed space confined by the air chamber 514 connected to the flexible membrane 508.

Figure 10:
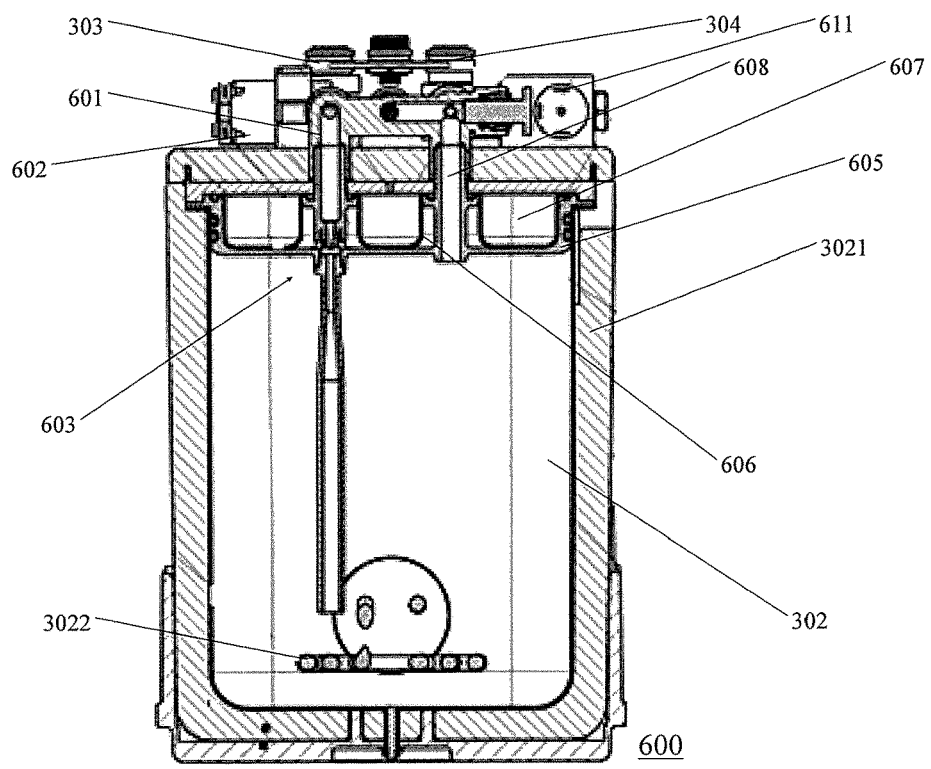
FIG. 10 is a schematic diagram of the section along the A-A direction in FIG. 8.

As shown in FIG. 10, the hot water supply pipeline 600 comprises: the second water inlet pipe 601 connected to the water inlet 303, on which the second solenoid valve 602 is equipped; the second water inlet pipe 601 extends into the heater 302, on which the Venturi effect part 603 is provided, and the reduction part 604 of the partial cross section of the Venturi effect part 603 leads to the closed space 607 confined by the flexible membrane in the shell 605; and the heater 302 comprises:

The barrel body 3021, which defines a space for water storage and heating; the second water inlet pipe 601 passes through the top of the barrel body 3021 and extends into the barrel body 3021; the shell 605 is set on the top of the barrel body 3021; the shell 605, for instance, has the same cross section as the barrel body 3021, on which the vent hole 612 is provided. A noumenon with one end opened and one end closed is equipped on the shell 605, which is sealed and fits flawlessly on the top of the barrel body 3021, and the periphery of the flexible membrane 606 is sealed and fixed on the lower surface of the periphery of the open end of the noumenon and the top of the barrel body 3201.

The heating tube 3022, which is arranged at the bottom of the barrel body 3201.

The hot water supply system also comprises the second water outlet pipe 608 connected to the water outlet 304, on which the one-way valve 609 is equipped; one end of the second water outlet pipe 608 is connected to the water outlet 304, and the other end extends to the barrel body 3021 of the heater and is flush with the lower edge of the shell 605.

Figure 11:
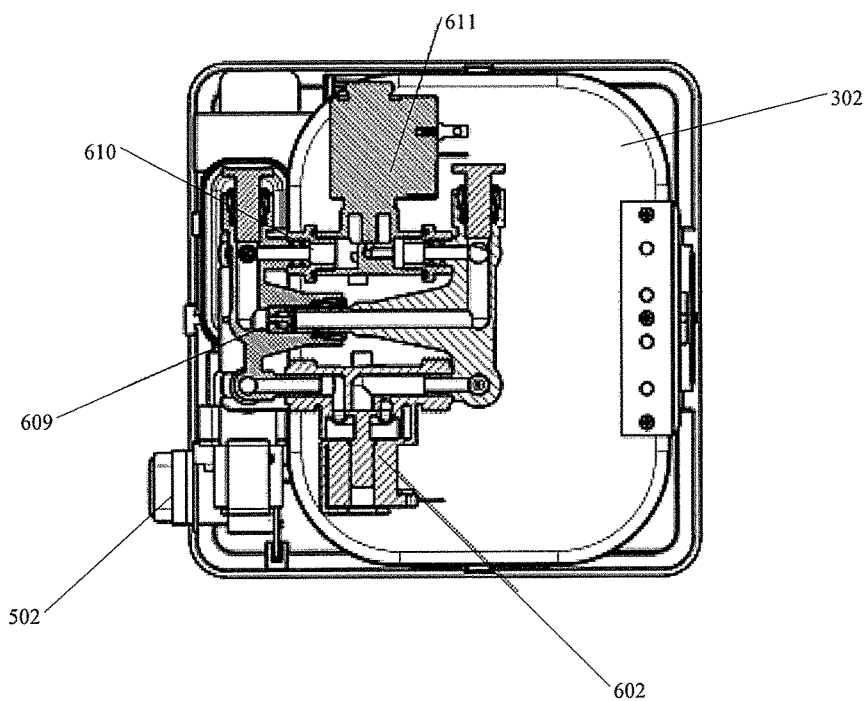
FIG. 11 is a schematic diagram of the section along the E-E direction in FIG. 8.

As shown in FIG. 11, the hot water supply system also comprises the backwater pipe 610 connected to the water outlet 304, on which the backwater solenoid valve 611 is equipped; the backwater pipe 610 is connected to the heater 302.

The filtered water control valve 202 is a touch switch, the first solenoid valve 502 and the second solenoid valve 602 are normally closed, and the backwater solenoid valve 611 is normally open; when the cold water supply pipeline supplies water, touching the touch switch and turning on the first solenoid valve 502 for water supply, the flexible membrane 508 set on the first water outlet pipe 502 shrinks under the action of Venturi effect part, to generate negative pressure in the closed space confined by it; re-touching the touch switch, the cold water supply pipeline is cut off, and the water in the first water outlet conduit is sucked back into the closed space formed in the flexible membrane 508, to complete the cold water return operation.

When the hot water supply pipeline supplies water, pressing and holding the touch switch 202 to turn on the second solenoid valve 602, the cold water enters the heater 302 for heating through the second water inlet pipe 601, after that, the water flows to the water outlet through the one-way valve 609 on the second water outlet 608. At the same time, the flexible membrane such as the gel silica membrane 606 connected to the second water outlet pipe 608 shrinks under the action of Venturi effect part, to generate negative pressure in the closed space confined by it, which even can empty out the closed space; re-touching and holding the touch switch, the second solenoid valve 602 is turned off and the hot water in the second outlet conduit flows into the heater 302 through the backwater solenoid valve 611 and returns back to the closed space to complete the hot water return operation.

The number of apparatuses and the treatment scale given herein are to simplify the description of the present invention. The application, modification and change of the faucet assembly of the present invention are apparent to the technicians in the field.

As mentioned above, according to the present invention, a Venturi effect part is mounted on the water supply pipeline, which leads to the closed space confined by the deformable elastic flexible membrane, so it has reliable water return effect, and at the same time, this structure is set in the heater, which not only can provide a reliable water return effect, but also can prevent the hot water from flowing over from the second water outlet pipe and thus causing leakage in the faucet outlet.

Although the embodiment of the present invention have been disclosed as above, they are not limited to the applications listed in the Specification and implementation modes. They can be applied to all kinds of fields suitable for the present invention. Additional modifications can be easily implemented for those who are familiar with the field. Therefore, the present invention is not limited to specific details and the legends shown and described herein without deviation from the general concepts confined in the Claim and the Equivalents.

What is claimed is:

1. A faucet assembly, comprising:
   a water supply pipeline, which comprises a water outlet pipeline section and a water inlet pipeline section connected to each other, wherein the water inlet pipeline section contains a throat section with a cross sectional diameter smaller than that of the rest of the water inlet pipeline section;
   a shell, which is made of hard materials and wrapped around the throat section, so as to define a space that contains air around the throat section, while the throat section has an opening to the space;
   a flexible membrane wrapping layer, which is made of elastic materials and is hermetically sealed on an inner side of the shell, so that the space that contains air has an elastic, retractable and sealed boundary;
   a heater, which is connected in series to the water inlet pipeline section and is positioned upstream of the shell along the water outlet direction, to heat the water that is about to flow into the throat section;
   another water inlet pipeline section, which is also connected to the water outlet pipeline section, such that water coming from the water inlet pipeline section and water coming from the another water inlet pipeline section both flow into the water outlet pipeline section, wherein the another water inlet pipeline section also contains an another throat section with a cross sectional diameter smaller than that of the rest of the another water inlet pipeline section;

another shell, which is made of hard materials and wrapped around the another throat section, so as to define an another space that contains air around the another throat section, while the another throat section has an opening to the another space; and another flexible membrane wrapping layer, which is made of elastic materials and is hermetically sealed on the inner side of the another shell, so that the another space that contains air has an elastic, retractable and sealed boundary, wherein the another water inlet pipeline section does not have a heater.

2. The faucet assembly as recited in claim 1, wherein a vent hole which is interconnected to the outside is equipped on the shell, so that the flexible membrane wrapping layer can smoothly squeeze or fill the air between the outer side of the flexible membrane wrapping layer and the inner side of the shell in the process of expansion and filling.

3. The faucet assembly as recited in claim 1, wherein the water inlet pipeline section is equipped with a switch valve for cutting off the upstream flow of the heater in the upstream of the heater along the water outlet direction.

4. The faucet assembly as recited in claim 1, wherein the another water inlet pipeline section is equipped with a switch valve for cutting off the upstream flow of the another shell in the upstream of the another shell along the water outlet direction.

5. The faucet assembly as recited in claim 1, further comprising a filter, which is connected in series to the water inlet pipeline section and set in the upstream side of the heater along the water outlet direction, to filter the water that is about to flow into the heater.

6. The faucet assembly as recited in claim 5, wherein the filter is configured to filter both the water coming from the another water inlet pipeline section and the water coming from the water inlet pipeline section.

7. The faucet assembly as recited in claim 1, further comprising:
a faucet, which comprises an outer shell with a water outlet;
a hose, which is set in the outer shell, and the first end of the hose is arranged in the water outlet, and the second end is connected to the outlet end of the water outlet pipeline section; and a water outlet channel is confined between the outer surface of the hose and the inner surface of the outer shell;
another water supply pipeline, which is arranged parallel to the water supply pipeline, and the another water supply pipeline comprises a cold water outlet pipeline section and a hot water outlet pipeline section which are connected in parallel to each other, wherein the cold and hot water outlet pipeline sections lead to the water outlet channel;
a water mixing valve, which is set in the outer shell, and the cold and hot water outlet pipeline sections lead to the water outlet channel through the water mixing valve.

8. The faucet assembly as recited in claim 7, further comprising:
a manual handle, which is mounted on the outer shell and connected to the water mixing valve, to operate the water mixing valve to enable the another water supply pipeline to output the water flow to the water outlet channel; and
a capacitive touch switch, which is installed on the outer shell, wherein the capacitive touch switch is connected in a circuit with a switch valve on provided the water inlet pipeline section and the another water inlet pipeline section so as to switch the water flow between the water inlet pipeline section and the another water inlet pipeline section by capacitive touch.

\* \* \* \* \*